United States Patent
Sternbach

(10) Patent No.: US 11,069,311 B1
(45) Date of Patent: Jul. 20, 2021

(54) COLORBLIND VIDEO ADAPTER

(71) Applicant: Robert Sternbach, Berkeley, CA (US)

(72) Inventor: Robert Sternbach, Berkeley, CA (US)

(*) Notice: Subject to any disclaimer, the term of this patent is extended or adjusted under 35 U.S.C. 154(b) by 0 days.

(21) Appl. No.: 16/847,228

(22) Filed: Apr. 13, 2020

(51) Int. Cl.
| | | |
|---|---|---|
| *G09G 5/10* | (2006.01) | |
| *G09G 3/36* | (2006.01) | |
| *G09G 3/20* | (2006.01) | |
| *G09G 5/02* | (2006.01) | |
| *H01L 27/32* | (2006.01) | |
| *H03F 3/45* | (2006.01) | |
| *H04N 5/70* | (2006.01) | |

(52) U.S. Cl.
CPC ......... *G09G 3/3607* (2013.01); *G09G 3/2003* (2013.01); *G09G 5/02* (2013.01); *H01L 27/3211* (2013.01); *H03F 3/45* (2013.01); *H04N 5/70* (2013.01); *G09G 2300/0452* (2013.01); *G09G 2320/0666* (2013.01)

(58) Field of Classification Search
CPC ...... G09G 3/3607; G09G 3/2003; G09G 5/02; G09G 2300/0452; G09G 2320/0666; H01L 27/3211; H03F 3/45; H04N 5/70

USPC ............................................... 345/204, 690
See application file for complete search history.

(56) References Cited

U.S. PATENT DOCUMENTS

| | | | | |
|---|---|---|---|---|
| 4,326,217 | A * | 4/1982 | Iwasawa | ............ H04N 1/00283 348/104 |
| 5,606,339 | A * | 2/1997 | Tsong | ...................... H04N 9/68 345/22 |
| 2005/0134800 | A1* | 6/2005 | Kim | ......................... H04N 9/68 351/242 |
| 2017/0039922 | A1* | 2/2017 | Chen | ..................... G09G 3/2003 |
| 2017/0163951 | A1* | 6/2017 | Getman | ................... G06T 5/008 |

* cited by examiner

*Primary Examiner* — Jennifer T Nguyen
(74) *Attorney, Agent, or Firm* — Kwan & Olynick LLP

(57) ABSTRACT

A colorblind video adapter may include four difference amplifiers. A first difference amplifier may amplify a red signal relative to a green signal to create a red contrast signal, while a second difference amplifier may amplify the green signal relative to the red signal to create a green contrast signal. Outputs from the first two difference amplifiers may be provided to a second two difference amplifiers. The third difference amplifier may sum the red input signal and the red contrast signal to create a red output signal, while the fourth difference amplifier may sum the green input signal and the green contrast signal to create a green output signal.

20 Claims, 5 Drawing Sheets

COLORBLIND VIDEO ADAPTER

COPYRIGHT NOTICE

A portion of the disclosure of this patent document contains material which is subject to copyright protection. The copyright owner has no objection to the facsimile reproduction by anyone of the patent document or the patent disclosure as it appears in the United States Patent and Trademark Office patent file or records but otherwise reserves all copyright rights whatsoever

FIELD OF TECHNOLOGY

This patent document relates generally to image signal processing and more specifically to video adapter technology.

BACKGROUND

Color blindness, also known as color vision deficiency, is the decreased ability to see color or differences in color. The most common cause of color blindness is a genetic problem in the development of one or more of the three sets of color-sensing cones in the eye. Red-green color blindness is the most common form.

Normal human color vision is determined by activity in three types of retinal cones, each containing a photopigment with a distinct frequency response. It is the differential response of these cones that is used to compute the color perception. Individuals with color vision deficiency (i.e., colorblindness) most often have a defect, rather than complete absence, of one of these photopigments. The defective photopigment has an abnormal frequency response, often too similar to one of the other photopigments. The result is difficulty distinguishing colors that depend on the differential activity of these cones.

The genes encoding the photopigments for the medium-wavelength (M) and long-wavelength (L) cones are located on the X chromosome. The relative activity in these M and L cones is most important in distinguishing colors along the red-green axis. This photopigment abnormality results in so-called "red-green" color blindness. More than 95% of all variations in human color vision is of this type. Since most males have only a single X chromosome, color blindness is more frequent in men (8%) than women (0.5%). It is very rare for males or females to be blind to the blue end of the spectrum. There is currently no cure for colorblindness.

Colorblindness imposes significant limitations on affected individuals. Individuals affected with colorblindness can have difficulty interpreting color in safety situations such as traffic or warning lights. However, less severe situations also present difficulties. For example, websites, computer programs, and other digital user interfaces may employ color schemes that create accessibility issues for colorblind individuals. As another example, colorblind individuals may be unable to fully appreciate visual media such as video or still images. In some situations, the inability to interpret color on display screens may render an individual ineligible for certain occupations or professional roles. Accordingly, techniques for improving visual perception for individuals affected with colorblindness are desired.

OVERVIEW

Provided are various techniques, mechanisms, processes, and non-transitory computer readable media relating to the processing of visual data. According to various embodiments, a device may include a first difference amplifier (first DA), a second difference amplifier (second DA), a third difference amplifier (third DA), and/or a fourth difference amplifier (fourth DA). The first difference amplifier (first DA) may have a first DA red input line, a first DA green input line, and/or a first DA output line. The second difference amplifier (second DA) may have a second DA red input line, a second DA green input line, and/or a second DA output line. The third difference amplifier (third DA) may have a third DA red input line, a third DA red contrast input line, and/or a third DA red output line. The fourth difference amplifier (fourth DA) may have a fourth DA green input line, a fourth DA green contrast input line, and/or a fourth DA green output line. The first DA output line may be connected to the third DA red contrast input line. The first DA red input line, the second DA red input line, and/or the third DA red input line may be connected to a circuit red input line. The circuit red input line corresponds with a red RGB (red, green, blue) output signal from a RGB video output port. The third DA may be configured to transmit a red signal via the third DA red output line to drive a red RGB input signal of a display device. The second DA output line may be connected to the fourth DA green contrast input line. the first DA green input line, the second DA green input line, and/or the third DA green input line may be connected to a circuit green input line. the circuit green input line corresponds with a green RGB output signal from a RGB video output port. The fourth DA may be configured to transmit a green signal via the fourth DA green output line to drive a green RGB input signal of the display device.

In some implementations, the first DA output line may be connected via a first potentiometer to the third DA red contrast input line. The second DA output line may be connected via a second potentiometer to the fourth DA green contrast input line.

In some embodiments, the device may include an input port configured to receive an RGB input signal. The RGB input signal may include a red input signal corresponding with the circuit red input line. The RGB input signal may include a green input signal corresponding with the circuit green input line. The RGB input signal may include a blue input signal.

In some embodiments, the device may include an output port configured to transmit an RGB output signal. The output port may include a red output signal corresponding with the circuit red output line. The RGB input signal may include a green output signal corresponding with the circuit green output line. The RGB input signal may include a blue output signal. The blue output signal may be identical to the blue input signal.

In some embodiments, the first DA output line may be connected via a red clipper circuit to the third DA red contrast input line. The red clipper circuit may be configured to limit a signal strength associated with the third DA red contrast input line. The second DA output line may be connected via a green clipper circuit to the fourth DA green contrast input line. The green clipper circuit may be configured to limit a signal strength associated with the third DA green contrast input line.

According to various embodiments, the first DA may include a first DA first voltage-to-current converter. The first DA first voltage-to-current converter may have a first DA first voltage-to-current converter first input line connected to the first DA red input line. The first DA first voltage-to-current converter may have a first DA first voltage-to-current converter second input line connected to the first DA green input line. The first DA first voltage-to-current converter may have a first DA first voltage-to-current converter output line. The first DA may include a first DA second voltage-to-current converter. The first DA second voltage-to-current converter may have a first DA second voltage-to-current converter first input line connected to a first DA ground input line. The first DA second voltage-to-current converter may have a first DA second voltage-to-current converter second input line connected to the first DA output line. The first DA second voltage-to-current converter may have a first DA second voltage-to-current converter output line. The first DA may include a high-impedance node connected to the first DA first voltage-to-current converter output line and/or the first DA second voltage-to-current converter output line. the first DA amplifier has a first DA amplifier output line connected to the first DA output line.

According to various embodiments, the second DA may include a second DA first voltage-to-current converter. The second DA first voltage-to-current converter may have a second DA first voltage-to-current converter first input line connected to the second DA red input line. The second DA first voltage-to-current converter may have a second DA first voltage-to-current converter second input line connected to the second DA green input line. The second DA first voltage-to-current converter may have a second DA first voltage-to-current converter output line. The second DA may include a second DA second voltage-to-current converter. The second DA second voltage-to-current converter may have a second DA second voltage-to-current converter first input line connected to a second DA ground input line. The second DA second voltage-to-current converter may have a second DA second voltage-to-current converter second input line connected to the second DA output line. The second DA second voltage-to-current converter may have a second DA second voltage-to-current converter output line. The second DA may include a high-impedance node connected to the second DA first voltage-to-current converter output line and/or the second DA second voltage-to-current converter output line. the second DA amplifier has a second DA amplifier output line connected to the second DA output line.

In some implementations, a video signal processing circuit may include an input port configured to receive a red input RGB video signal and/or a green input RGB video signal, a first difference amplifier (first DA) configured to produce a red contrast signal by amplifying the red input video signal relative to the green input video signal, a second difference amplifier (first DA) configured to produce a green contrast signal by amplifying the green input video signal relative to the red input video signal, a third difference amplifier (third DA) configured to produce a red intensity signal by summing the red contrast signal and/or the red input RGB video signal, a fourth difference amplifier (fourth DA) configured to produce a green intensity signal by summing the green contrast signal and/or the green input RGB video signal, and/or an output port configured to transmit a red output RGB video signal and/or a green output RGB video signal based on the red intensity signal and/or the green intensity signal.

According to various embodiments, the video signal processing circuit may also include a first potentiometer configured to modulate the red intensity signal and/or a second potentiometer configured to modulate the green intensity signal. The first DA may be connected to the third DA via a red clipper circuit configured to limit a signal strength associated with the red contrast signal, and/or the second DA may be connected to the fourth DA via a green clipper circuit configured to limit a signal strength associated with the green contrast signal.

According to various embodiments, a system may include an input port configured to receive an input video signal comprising red, green. blue RGB video input signals. The system may also include a video signal processor configured to amplify a first contrast level of the red video input signal relative to the green input signal to create a red video output signal and/or to amplify a second contrast level of the green video input signal relative to the red input signal to create a green video output signal. The system may also include an output port configured to transmit an output video signal comprising the altered red and/or green video output signals and/or the unaltered blue video input signal; along with the horizontal and/or vertical sync signals. The system may also include a display device configured to display information based on the output video signal.

In some embodiments, the video signal processor may include a first difference amplifier (DA) configured to amplify the first contrast level, a second DA configured to amplify the second contrast level, a third DA configured to determine a red intensity level for the altered red video output signal, a fourth DA configured to determine a green intensity level for the altered green video output signal. The third DA may receive as output a red contrast signal from the first DA. The fourth DA may receive as output a green contrast signal from the second DA.

In some embodiments, the first DA may be connected to the third DA via a red clipper circuit configured to limit a signal strength associated with the red contrast signal. The second DA may be connected to the fourth DA via a green clipper circuit configured to limit a signal strength associated with the green contrast signal.

In some embodiments, the system may include a first potentiometer configured to modulate the red video output signal, a second potentiometer configured to modulate the green video output signal, and/or a user input port configured to receive a signal for adjusting the first potentiometer and the second potentiometer.

These and other embodiments are described further below with reference to the figures.

BRIEF DESCRIPTION OF THE DRAWINGS

The included drawings are for illustrative purposes and serve only to provide examples of possible structures and operations for the disclosed inventive systems, apparatus, methods and computer program products for processing visual data. These drawings in no way limit any changes in form and detail that may be made by one skilled in the art without departing from the spirit and scope of the disclosed implementations.

DETAILED DESCRIPTION

Figure 1:
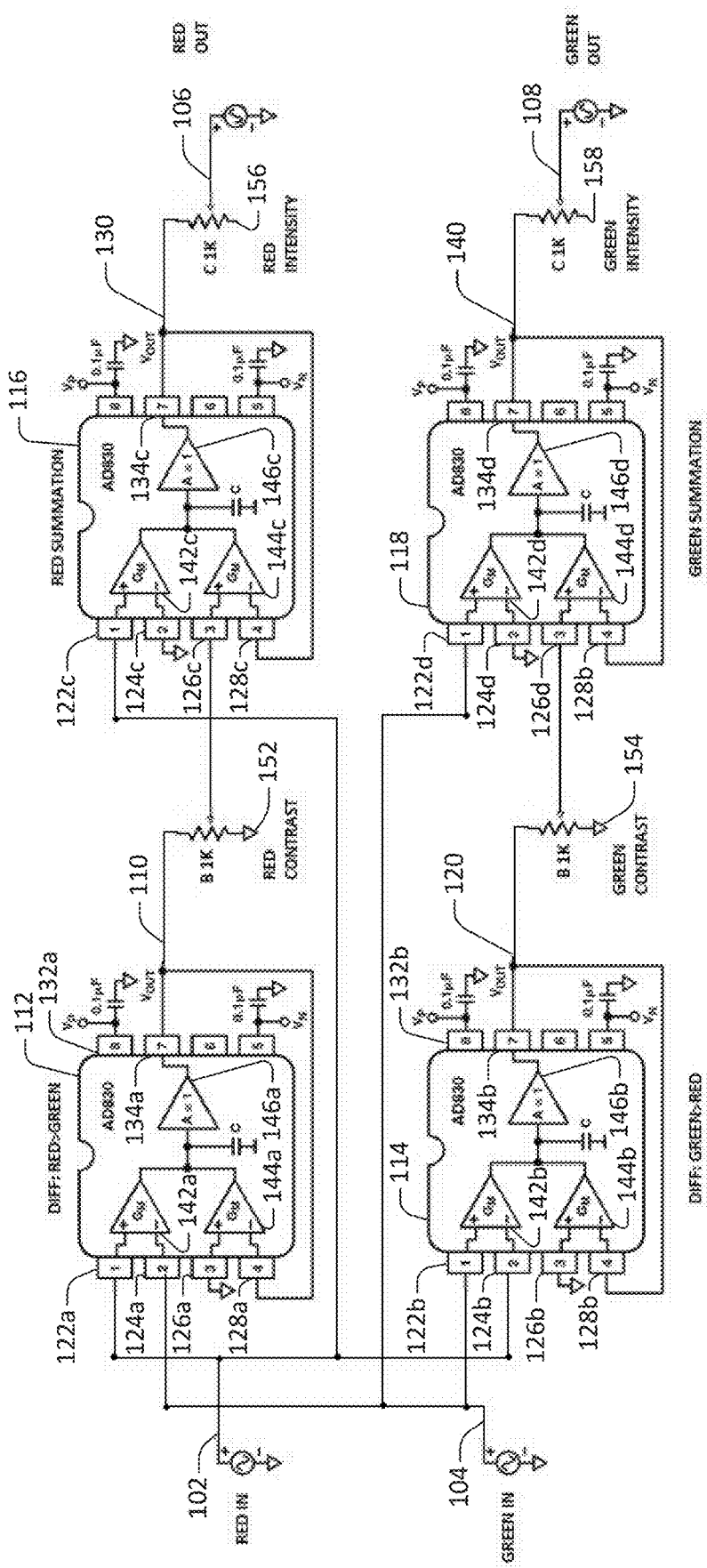
FIG. 1 illustrates an example of a colorblind visual data adapter, configured in accordance with one or more embodiments.

Several attempts have been made to correct for colorblindness using specialized optical lenses worn as contact lenses or in eyeglasses. For example, lenses that filter certain wavelengths of light can allow people with a cone anomaly, but not dichromacy, to see better separation of colors, especially those with classic "red/green" color blindness. They work by notching out wavelengths that strongly stimulate both red and green cones in a deuter- or protanomalous person, improving the distinction between the two cones' signals. As another example, colored spectacle lenses or a single red-tint contact lens can be worn on the non-dominant eye.

However, lens-based approaches to addressing colorblindness are of limited usefulness. While specialized lenses may improve discrimination of some colors, they can make other colors more difficult to distinguish. Since they may operate by filtering light, they may not be usable in low light situations. Specialized lenses can also help the wearer to achieve a better score on certain color vision tests without correcting color vision in the natural environment.

As another approach, many mobile applications have been developed to help colorblind people view colors in a better way. However, mobile applications are of little assistance on devices that do not have the ability to install such applications, such as conventional display screens and televisions. Such applications that involve digital imaging processing may not be able to perform quickly enough to display the images in real time.

According to various embodiments, techniques and mechanisms described herein employ a two-stage process in which the red and/or green signals in a video may be altered to increase the red-green contrast. For example, the green signal may be subtracted from the red signal, for instance using a red-over-green difference amplifier (DA). In such a configuration, the red-over-green DA produces a positive output voltage when the input signal has a higher red input voltage and a negative output voltage when there is a higher green input voltage. In the second stage, this difference signal is then added back to the original red input signal in a summation DA. Since the red output signal is increased for colors where the red signal is greater than the green signal, there will be more of an increase in L cone activity than in M cone activity. For colors where the green signal is greater than the red signal, the activity of the L cones will decrease more than the M cones. The converse occurs for the green signal.

After transformation, modified red and green output signals have a larger difference between them, increasing the contrast along the red-green axis relative to the input. This transformation results in an increased disparity in the activity of the M and L cones. However, colors having an equal amount of red and green signal, such as those on the blue-yellow or black-white axes, are unaltered.

For example, many colors have relatively small red-green differences, which make these colors difficult to distinguish for color deficient individuals. For instance, chocolate brown and forest green have RGB values of (82,41,12) and (13,55,13) respectively, with differences of less than 40 between red and green values. By magnifying the difference between red and green for each pixel, color deficient individuals are better able to distinguish between colors that would otherwise appear very similar.

In some implementations, variable resistors may be used to control the amount of difference signal to be added, so that individual variations in the degree and type of colorblindness can be accommodated.

In some embodiments, one or more clipper circuits may be used to cap the amount of difference signal to be added. A clipper circuit may help to limit or eliminate contrast amplification when there is already a large red-green signal difference, such as (240, 0, 0). That is, the clipper circuit allows greater amplification of the moderate-sized difference signals, without oversaturation when there are already large differences. One or more clipper circuits may be user-configurable to account for individual variations in the degree and type of colorblindness can be accommodated.

According to various embodiments, techniques and mechanisms described herein may be used to transform an image or video signal. Although the modified output may appear abnormal to those with normal color vision, this increased red-green contrast will be reduced in those with red-green color blindness because of the photopigment defect. For colorblind individuals, the modified colors will increase the disparity in the activity of the M and L cones, bringing it closer to those who have normal color vision when they view the unenhanced image. The resultant color perception for colorblind individuals will be closer to normal color vision.

Techniques and mechanisms described herein provide for various approaches for correcting for colorblindness. For example, a colorblind visual data adapter may be interposed between a video source signal, such as a Video Graphics Array (VGA) video source, and a video source display, such as the television or computer monitor video port or ports. The image or video received from the video source may be transformed by the colorblind visual data adapter so that the signal received by the signal sync is corrected for colorblind viewing. The resulting video feed may provide for image data that exhibits less accurate color viewing for an individual having normal color vision but more accurate color viewing for an individual affected by colorblindness. In some embodiments, the colorblind visual data adapter may be adjustable to provide for more or less color correction, depending on the level of colorblindness of the particular individual.

According to various embodiments, techniques and mechanisms described herein may be used to address many of the disadvantages experienced by colorblind individuals. For example, output on a display screen may be color corrected without requiring the installation of a specialized application, which may be impossible in many contexts. As another example, red-green colorblindness may be corrected without distorting the presentation of certain colors, as is typically the case when specialized lenses are used.

In some implementations, the CVDA may transform an analog visual data signal so as to increase the color contrast to correct for colorblindness. For example, a display screen presenting video or still images based on the transformed signal may provide an image in which colorblind individuals may more easily discriminate between colors. In addition, color distortion may be reduced relative to specialized lenses, for instance by electronically modifying the image with the color correction mechanism, rather than filtering it.

FIG. 1 illustrates an example of a colorblind visual data adapter 100, configured in accordance with one or more embodiments. According to various embodiments, the CVDA may be configured to receive red and green visual data input signals 102 and 104, to increase the contrast between those signals, and to transmit transformed red and green visual data input signals 106 and 108.

The CVDA includes four difference amplifiers, including the red over green DA 112, the green over red DA 114, the red summation DA 116, and the green summation DA 118. In some implementations, each DA may be an AD830 High Speed, Video Difference Amplifier available from Analog Devices, Inc. of Norwood, Mass. The AD830 is a wideband, differencing amplifier designed for use at video frequencies and other applications. It accurately amplifies a fully differential signal at the input and produces an output voltage referred to a user-chosen level. The undesired common-mode signal is rejected, even at high frequencies. High impedance inputs ease interfacing to finite source impedances and, thus, preserve the excellent common-mode rejection. It offers significant advantages in many applications, in particular in high frequency common-mode rejection and in level shifting applications. Low distortion is preserved over the many possible differential and common-mode voltages at the input and output. Additional details regarding the AD830 are discussed in the AD830 Data Sheet, which is hereby incorporated by reference in its entirety and for all purposes.

It should be noted that although the CVDA is described as including four AD830 difference amplifiers, an analog device that performs the functions described herein may be configured in a different way. For example, a CVDA may include different types or numbers of difference amplifiers. Accordingly, the CVDA 100 is provided as an example of an analog device effective for performing colorblindness correction on a video data stream and is illustrative of concepts described in this disclosure. However, the CVDA 100 is only one example of a device that embodies these principles and is not intended to be construed as limiting in any way.

Each DA includes four input ports, 2 positive and 2 negative. For example, the red over green DA 112 includes the positive input ports 122a and 126a, and negative input ports 124a and 128a. The green over red DA 114 includes the positive input ports 122b and 126b, and negative input ports 124b and 128b. The red summation DA 116 includes the positive input ports 122c and 126c, and negative input ports 124c and 128c. The green summation DA 118 includes the positive input ports 122d and 126d, and negative input ports 124d, and 128d.

Each DA includes one output port. For example, the red over green DA 112 includes the output port 134a. The green over red DA 114 includes the output port 134b. The red summation DA 116 include the output port 134c. The green summation DA 118 includes the output port 134d.

In the example embodiment shown in FIG. 1, each DA includes two voltage-to-current converters that function as input and feedback signal interfaces. For example, the red over green DA 112 includes the voltage-to-current converters 142a and 144a. The green over red DA 114 includes the voltage-to-current converters 142b and 144b. The red summation DA 116 includes voltage-to-current converters 142c and 144c. The green summation DA 118 includes the voltage-to-current converters 142d and 144d. In each voltage-to-current converter, the transconductance is a large signal quantity, unlike in the front end of most op amps.

In the example embodiment shown in FIG. 1, each DA includes a high impedance node, which is characterized by an equivalent resistance and capacitance connected to an ac common. For example, the red over green DA 112 includes the high impedance node 146a. The green over red DA 114 includes the high impedance node 146b. The red summation DA 116 includes the high impedance node 146c. The green summation DA 118 includes the high impedance node 146d. A unity voltage gain stage follows the high impedance node to provide buffering from loads.

The red over green DA 112 is configured to increase the contrast of the red input signal 102 relative to the green input signal 104. The positive input port 122a is connected to the red input signal 102. The negative input port 124a is connected to the green input signal 104. The positive input port 126a is connected to ground. The negative input port 128a is connected to the output port 134a, hence the amplifier is operating in a "closed loop" mode. The output port 134a provides the red contrast signal 110. The linear potentiometer 152 modulates the voltage of the contrast signal being transmitted to red summation DA 116.

The green over red DA 114 is configured to increase the contrast of the green input signal 104 relative to the red input signal 102. The positive input port 122b is connected to the green input signal 104. The negative input port 124b is connected to the red input signal 102. The positive input port 126b is connected to ground. The negative input port 128b is connected to the output port 134b, hence the amplifier is operating in a "closed loop" mode. The output port 134b provides the green contrast signal 120. The linear potentiometer 154 modulates the voltage of the contrast signal being transmitted to green summation DA 118.

The red summation DA 116 is configured to modulate the intensity of the red output signal 106 by summing the red contrast signal 110 with the red input signal 102. The positive input port 122c is connected to the red input signal 102. The negative input port 124c is connected to ground. The positive input port 126c is connected to the red contrast signal 110. The negative input port 128c is connected to the red intensity output signal 130, hence the amplifier is operating in a "closed loop" mode. The output port 134c provides the red intensity signal 130. The output voltage of the red intensity signal 130 is modulated by reverse log potentiometer 156.

The green summation DA 118 is configured to modulate the intensity of the green output signal 108 based on the green contrast signal 120 and the green input signal 104. The positive input port 122d is connected to the green input signal 104. The negative input port 124d is connected to ground. The positive input port 126d is connected to the green contrast signal 120. The negative input port 128d is connected to the green intensity output signal 140, hence the amplifier is operating in a "closed loop" mode. The output port 134d provides the green intensity signal 140. The output voltage of the green intensity signal 140 is modulated by reverse log potentiometer 158.

Figure 2:
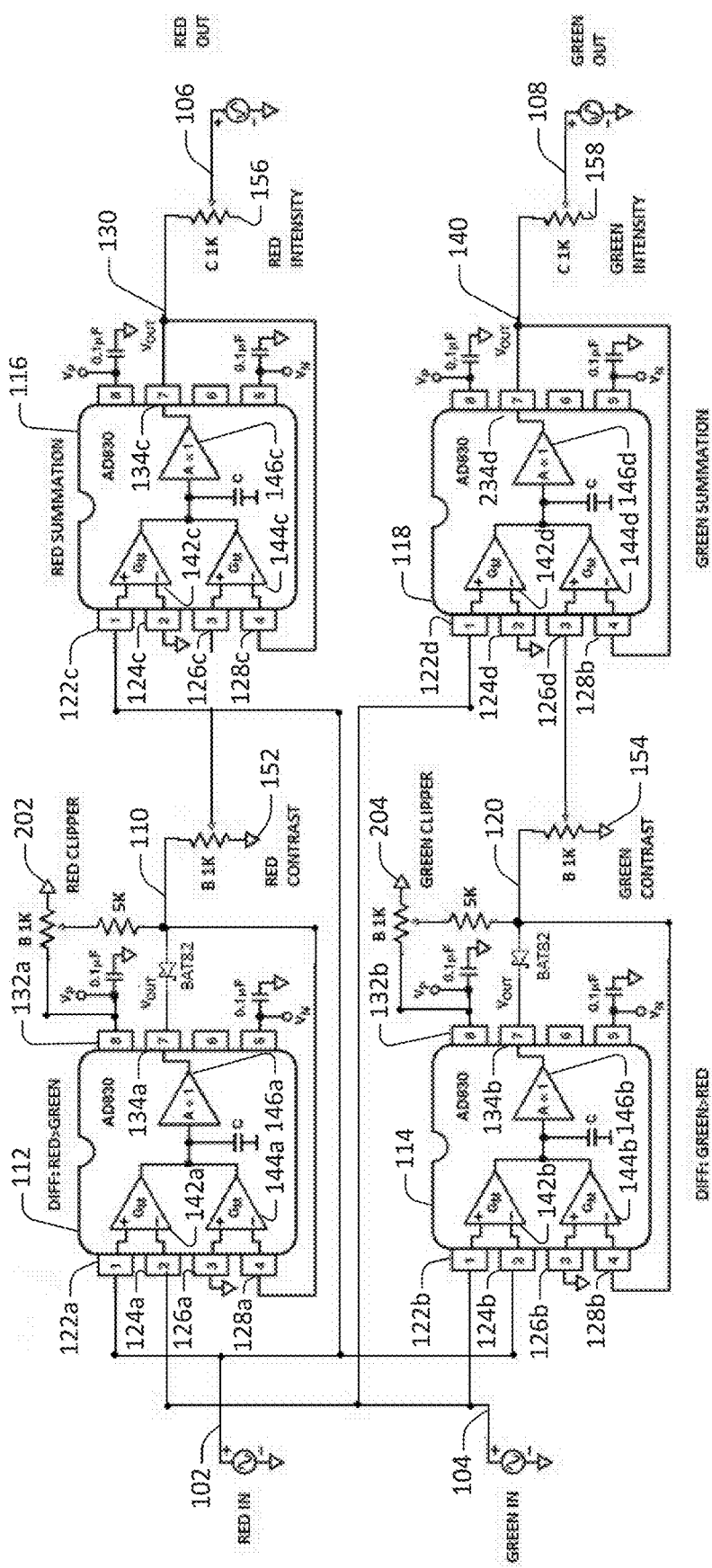
FIG. 2 illustrates another example of a colorblind visual data adapter, configured in accordance with one or more embodiments.

FIG. 2 illustrates another example of a colorblind visual data adapter 200, configured in accordance with one or more embodiments. According to various embodiments, the colorblind visual data adapter 200 shown in FIG. 2 is substantially similar to the colorblind visual data adapter 100 shown in FIG. 1.

The colorblind visual data adapter 200 includes a red clipper circuit 202. In some implementations, the red clipper circuit 202 may be configured by adding a diode to the output 134a. For example, a BAT82 diode from NXP Semiconductors of Austin, Tex. may be used. In addition, the clipper circuit may include a loop containing a resister. For instance, a 5K resister may be used. The clipper circuit may also include a potentiometer connected to a positive input power supply 132a.

In some implementations, the red clipper circuit 202 can help to limit the red voltage contrast signal 110 being transmitted to the red summation DA 116. By limiting the red voltage contrast signal 110 in this way, the colorblind visual data adapter 200 may avoid excessively transmitting an excessively high red voltage contrast signal 110 for signals in which the level of contrast is already high at the time of signal input.

The colorblind visual data adapter 200 also includes a green clipper circuit 204. In some implementations, the green clipper circuit 204 may be configured by adding a diode to the output 134b. In addition, the clipper circuit may include a loop containing a resister. For instance, a 5K resister may be used. The clipper circuit may also include a potentiometer connected to a positive input power supply 132b.

In some implementations, the green clipper circuit 204 can help to limit the green voltage contrast signal 120 being transmitted to the green summation DA 118. By limiting the green voltage contrast signal 120 in this way, the colorblind visual data adapter 200 may avoid transmitting an excessively high green voltage contrast signal 120 for signals in which the level of contrast is already high at the time of signal input.

According to various embodiments, a clipper circuit may help to limit the contrast enhancement in situations in which contrast is already high. For example, if a pixel has an RGB value of (240, 0, 0), even a color deficient individual would be able to discern that it is red. In such a situation, the clipper circuit could help to avoid unnecessarily increasing the contrast between green and red. However, the clipper circuit would not restrict contrast enhancement for pixels having a much smaller difference between red and green values, such as chocolate brown (82,41,12) and forest green (13,55,13).

Figure 3:
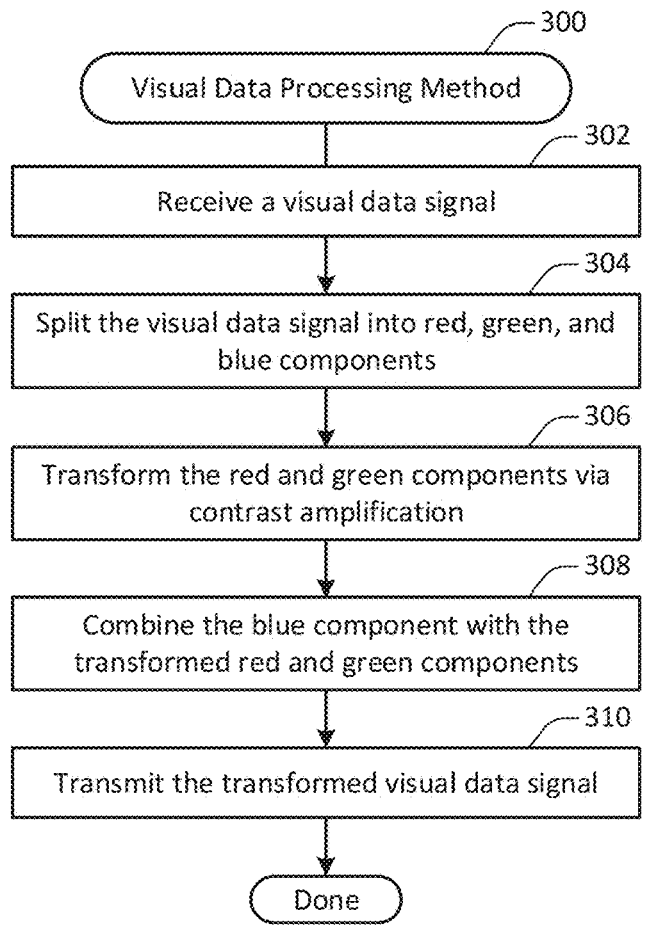
FIG. 3 illustrates an example of a method for processing visual data, performed in accordance with one or more embodiments.

FIG. 3 illustrates an example of a method 300 for processing visual data, performed in accordance with one or more embodiments. According to various embodiments, the method 300 may be performed on any of a variety of suitable computing devices. In some configurations, the source video signal may be provided in RGB format, as can be obtained from a standard VGA connector. Alternately, an RGB signal can easily be obtained from digital sources such as HDMI, for instance with the use of a readily available HDMI to VGA converter. As still another possibility, a digital signal processing method may be employed.

Figure 4:
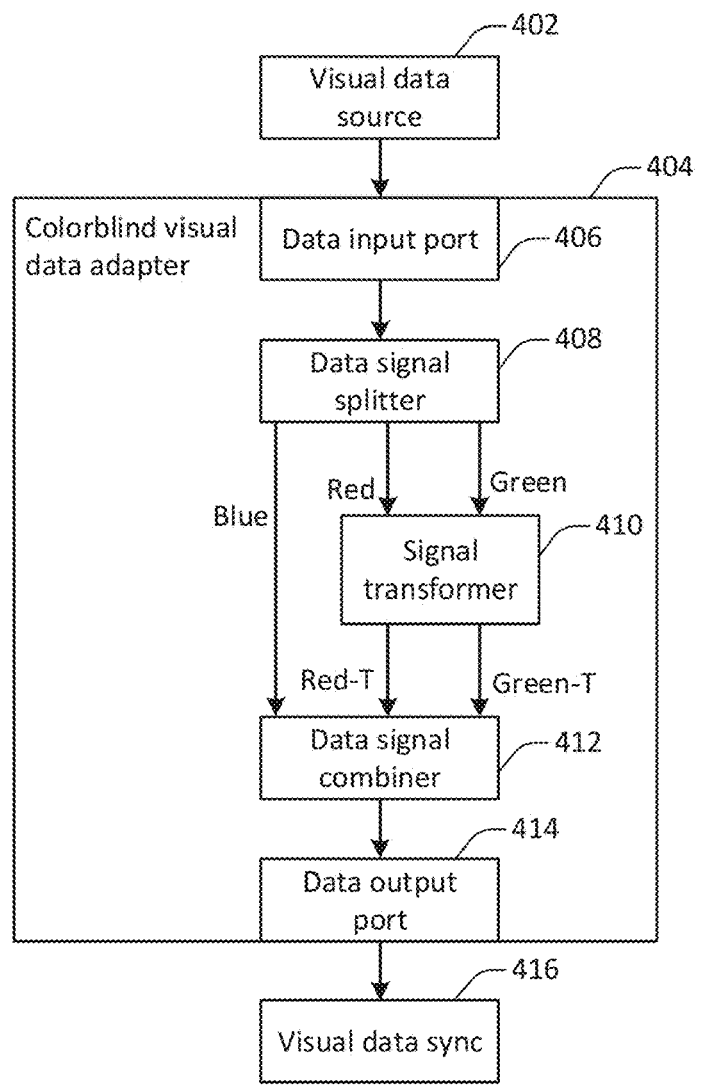
FIG. 4 illustrates an example of an arrangement of components in a visual data processing system, configured in accordance with one or more embodiments.

The method 300 is described herein partially in reference to FIG. 4, which illustrates an example of an arrangement of components in a visual data processing system 400, configured in accordance with one or more embodiments. The visual data processing system 400 includes a visual data source 402 that provides data for transformation to a colorblind visual data adapter 404. The colorblind visual data adapter 404 transforms the data and provides the transformed data to a visual data sync 416. The colorblind visual data adapter 404 includes a data input port 406, a data signal splitter 408, a signal transformer 410, a data signal combiner 412, and a data output port 414.

According to various embodiments, the visual data processing system 400 may include one or more data input ports. In addition to visual data received as input and transmitted as output, the visual data processing system 400 may receive configuration information. For example, the visual data processing system 400 may receive information for configuring the strength of red contrast amplification, the strength of green contrast amplification, the intensity of the red video signal, the intensity of the green video signal, the limiting effect of the red clipper circuit, and/or the limiting effect of the green clipper circuit.

Configuration may be provided directly to one or more components of the colorblind visual data adapter 400, for instance by adjusting a dial connected with a potentiometer. Alternately, or additionally, configuration information may be stored in transitory and/or non-transitory memory associated with the colorblind visual data adapter 400.

According to various embodiments, the method 300 may be employed to process visual data in a variety of contexts. For example, the method may be employed to convert data immediately prior to being received as an input for presentation on a display device. As another example, the method may be employed to convert data for transmission, for instance in a video streaming context to a digital television, for example by using a readily available VGA to HDMI converter. As another example, the method may be employed to convert data for encoding, for instance when generating a recorded video file for colorblind viewing.

Thus, according to various embodiments, the visual data source 402 may be any suitable data source such as an analog video out port from a computing device or a digital video out port using an HDMI to VGA converter. For example, the colorblind visual data adapter 404 may be a self-contained analog or digital signal processing device positioned between an analog or digital visual data source and an analog or digital visual data display. FIG. 1 illustrates one configuration of a self-contained analog signal processing device arranged in accordance with one or more embodiments. As another example, the colorblind visual data adapter 404 may be an integrated component within a larger computing device, such as a visual data processor. As yet another example, the colorblind visual data adapter 404 may be implemented at least partially in software executed on a processor such as a general purpose CPU.

A visual data signal is received at 302. In some implementations, the visual data signal may be received at an interface in communication with a signal processing apparatus. For example, the visual data signal may be received at an analog or digital communication port such as the data input port 406 shown in FIG. 4.

In some implementations, the data input port 406 may be configured to receive a user input signal for adjusting a setting associated with one or more potentiometers within the colorblind visual data adapter.

In some embodiments, the visual data signal may be received as an RGB analog video signal in which three signals (i.e., red, green, and blue) are carried on three separate cables or pins. In addition to the three color signals, the visual data may include one or more additional signals to synchronize the visual data.

In some embodiments, a different type of visual data signal may be received, and then converted to an RGB format. Examples of suitable visual data signals may include, but are not limited to: composite analog video signals, digital video signals, and S-Video signals According to various embodiments, the visual data signal may encode any of a variety of types of visual data. For example, the visual data signal may encode data for one or more still images. As another example, the visual data signal may encode data for video.

The visual data signal is split into red, green, and blue signals at 304. For example, the visual data signal may be split at the data signal splitter 408 shown in FIG. 4. In some implementations, such as in the case of a VGA video signal, the video signal may already be split into red, green, and blue signals. In other configurations, additional processing may be required. For instance, in the digital example, signal splitting may be accomplished by identifying red, green, and blue pixel values for each pixel represented in a digital visual data signal.

The red and green signals are transformed via contrast amplification at 306. For example, the signals may be transformed at the signal transformer 410 shown in FIG. 4. In some embodiments, contrast amplification may involve one or more analog signal processing operations performed via an analog signal processing device, such as one or more operations performed as discussed with respect to the device 100 shown in FIG. 1. Alternately, or additionally, one or more digital signal processing operations may be performed.

In some embodiments, digital signal processing operations may involve histogram equalization. The digital signal for an image frame is first represented as a histogram. Through this adjustment, the intensities can be better distributed on the histogram. This allows for areas of lower local contrast to gain a higher contrast. Histogram equalization accomplishes this by effectively spreading out the most frequent intensity values in a computationally efficient way.

In some embodiments, digital signal processing operations may involve adaptive histogram equalization (AHE). It differs from ordinary histogram equalization in the respect that the adaptive method computes several histograms, each corresponding to a distinct section of the image, and uses them to redistribute the lightness values of the image. As a modification, contrast limited AHE (CLAHE) may be used to reduce noise amplification in near-constant regions.

The blue signal is not altered before being combined with the transformed red and green signals at 408. For example, the signals may be combined at the data signal combiner 412 shown in FIG. 4. In some embodiments, the signals may be combined by performing the inverse of the operations performed at 304. For instance, in the analog case, such operations may involve physically recombining the transformed red and green signal pins with the blue signal pin and any other additional signal pins such as one or more timing signal pins.

The transformed visual data signal is transmitted at 410. For example, the transformed visual data signal may be transmitted from the data output port 414 to the visual data sync 416 shown in FIG. 4. According to various embodiments, the transformed visual data signal may be transmitted to any suitable source. As described with respect to the operation 302, such sources may include, but are not limited to: a display screen, a remote computing device in communication via a network, a storage device, and/or a data transcoder or encoder.

In some embodiments, the transformed visual data may be transmitted through the same interface at which it was received at 302. Alternately, or additionally, another interface may be used to transmit the transformed visual data. For example, the visual data may be received at a single interface but then transformed and transmitted via multiple interfaces to different data sources.

Figure 5:
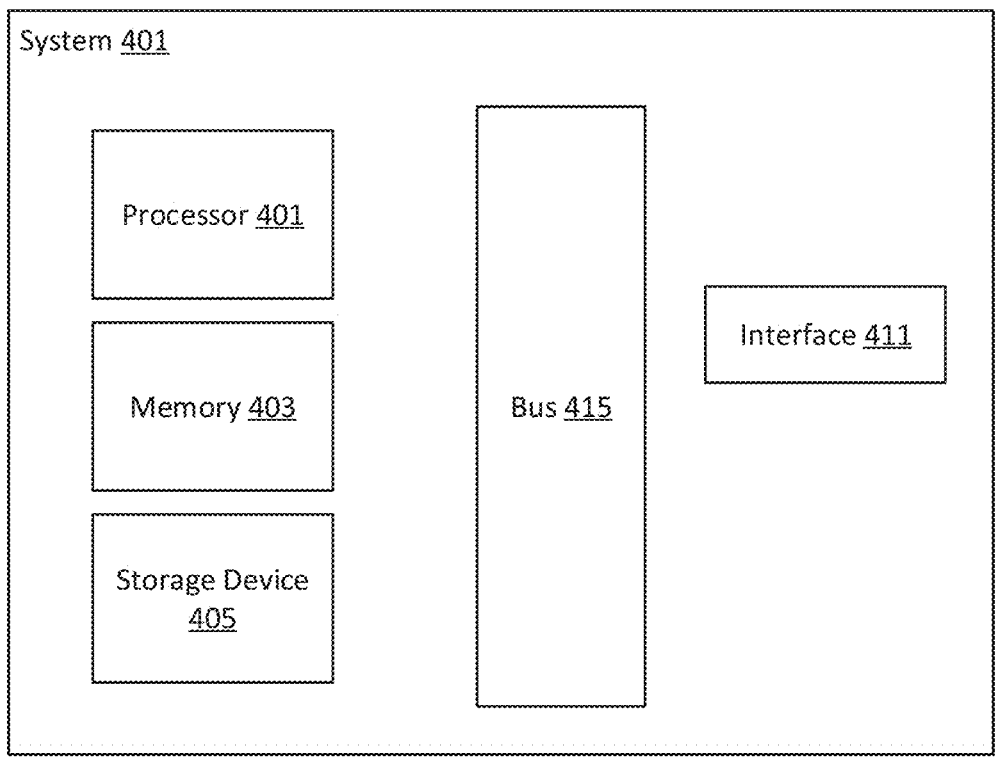
FIG. 5 illustrates an example of a computing device, configured in accordance with one or more embodiments.

FIG. 5 illustrates one example of a computing device. According to particular embodiments, a system 500 suitable for implementing particular embodiments of the present invention includes a processor 501, a memory module 503, a storage device 505, an interface 511, and a bus 515 (e.g., a PCI bus or other interconnection fabric) and operates as server, client device, or any other device or service described herein. Various specially configured devices can also be used in place of a processor 501 or in addition to processor 501. The interface 511 is typically configured to send and receive data packets over a network. According to various embodiments, devices such as a colorblind visual data adapter may be implemented on a device such as the system 500. The processor 501 may perform operations such as those described throughout this application, an in particular operations described with respect to embodiments described herein. Instructions for performing such operations may be embodied in the memory 503, on one or more non-transitory computer readable media, or on some other storage device.

Particular examples of interfaces supported include Ethernet interfaces, frame relay interfaces, cable interfaces, DSL interfaces, token ring interfaces, and the like. In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. Although a particular computing device is described, it should be recognized that a variety of alternative configurations are possible.

The foregoing specification refers to the amplification of contrast between red and green colors. However, it should be appreciated that the techniques and mechanisms are applicable to other types of contrast amplification, such as the amplification along the blue-yellow axis.

It should be understood that some of the disclosed implementations can be embodied in the form of control logic using hardware and/or computer software in a modular or integrated manner. Other ways and/or methods are possible using hardware and a combination of hardware and software.

Any of the disclosed implementations may be embodied in various types of hardware, software, firmware, and combinations thereof. For example, some techniques disclosed herein may be implemented, at least in part, by computer-readable media that include program instructions, state information, etc., for performing various services and operations described herein. Examples of program instructions include both machine code, such as produced by a compiler, and files containing higher-level code that may be executed by a computing device such as a server or other data processing apparatus using an interpreter. Examples of computer-readable media include, but are not limited to: magnetic media such as hard disks, floppy disks, and magnetic tape; optical media such as flash memory, compact disk (CD) or digital versatile disk (DVD); magneto-optical media; and hardware devices specially configured to store program instructions, such as read-only memory ("ROM") devices and random-access memory ("RAM") devices. A computer-readable medium may be any combination of such storage devices.

Any of the operations and techniques described in this application may be implemented as software code to be executed by a processor using any suitable computer language such as, for example, Java, C++ or Perl using, for example, object-oriented techniques. The software code may be stored as a series of instructions or commands on a computer-readable medium. Computer-readable media encoded with the software/program code may be packaged with a compatible device or provided separately from other devices (e.g., via Internet download). Any such computer-readable medium may reside on or within a single computing device or an entire computer system, and may be among other computer-readable media within a system or network. A computer system or computing device may include a monitor, printer, or other suitable display for providing any of the results mentioned herein to a user.

In the foregoing specification, various techniques and mechanisms may have been described in singular form for clarity. However, it should be noted that some embodiments include multiple iterations of a technique or multiple instantiations of a mechanism unless noted otherwise. For example, a system uses a processor in a variety of contexts. However, it will be appreciated that a system can use multiple processors while remaining within the scope of the present invention unless otherwise noted.

In the foregoing specification, various techniques and mechanisms may have been described as including a connection between two entities. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

In the foregoing specification, reference was made in detail to some specific embodiments including one or more of the best modes contemplated by the inventors. While various implementations have been described herein, it should be understood that they have been presented by way of example only, and not limitation. On the contrary, the breadth and scope of the present application should not be limited by any of the implementations described herein, but should be defined only in accordance with the following and later-submitted claims and their equivalents.

The invention claimed is:

1. A colorblind video adapter comprising:
a first difference amplifier (first DA) having a first DA red input line, a first DA green input line, and a first DA output line;
a second difference amplifier (second DA) having a second DA red input line, a second DA green input line, and a second DA output line;
a third difference amplifier (third DA) having a third DA red input line, a third DA red contrast input line, and a third DA red output line, wherein the first DA output line is connected to the third DA red contrast input line, wherein the first DA red input line, the second DA red input line, and the third DA red input line are connected to a circuit red input line, wherein the circuit red input line corresponds with a red RGB (red, green, blue) output signal from a RGB video output port, and wherein the third DA is configured to transmit a red signal via the third DA red output line to drive a red RGB input signal of a display device; and
a fourth difference amplifier (fourth DA) having a fourth DA green input line, a fourth DA green contrast input line, and a fourth DA green output line, wherein the second DA output line is connected to the fourth DA green contrast input line, wherein the first DA green input line, the second DA green input line, and the third DA green input line are connected to a circuit green input line, wherein the circuit green input line corresponds with a green RGB output signal from a RGB video output port, and wherein the fourth DA is configured to transmit a green signal via the fourth DA green output line to drive a green RGB input signal of the display device.

2. The colorblind video adapter recited in claim 1, wherein the first DA output line is connected via a first potentiometer to the third DA red contrast input line, and wherein the second DA output line is connected via a second potentiometer to the fourth DA green contrast input line.

3. The colorblind video adapter recited in claim 1, the device further comprising an input port configured to receive an RGB input signal, the RGB input signal including a red input signal corresponding with the circuit red input line, the RGB input signal including a green input signal corresponding with the circuit green input line, the RGB input signal including a blue input signal.

4. The colorblind video adapter recited in claim 3, the device further comprising an output port configured to transmit an RGB output signal, the output port including a red output signal corresponding with the circuit red output line, the RGB input signal including a green output signal corresponding with the circuit green output line, the RGB input signal including a blue output signal.

5. The colorblind video adapter recited in claim 4, wherein the blue output signal is identical to the blue input signal.

6. The device colorblind video adapter recited in claim 1, wherein the first DA output line is connected via a red clipper circuit to the third DA red contrast input line, the red clipper circuit being configured to limit a signal strength associated with the third DA red contrast input line.

7. The colorblind video adapter recited in claim 1, wherein the second DA output line is connected via a green clipper circuit to the fourth DA green contrast input line, the green clipper circuit being configured to limit a signal strength associated with the third DA green contrast input line.

8. The colorblind video adapter recited in claim 1,
wherein the first DA includes a first DA first voltage-to-current converter, the first DA first voltage-to-current converter having a first DA first voltage-to-current converter first input line connected to the first DA red input line, the first DA first voltage-to-current converter having a first DA first voltage-to-current converter second input line connected to the first DA green input line, the first DA first voltage-to-current converter having a first DA first voltage-to-current converter output line,
wherein the first DA includes a first DA second voltage-to-current converter, the first DA second voltage-to-current converter having a first DA second voltage-to-current converter first input line connected to a first DA ground input line, the first DA second voltage-to-current converter having a first DA second voltage-to-current converter second input line connected to the first DA output line, the first DA second voltage-to-current converter having a first DA second voltage-to-current converter output line, and
wherein the first DA includes a high-impedance node connected to the first DA first voltage-to-current converter output line and the first DA second voltage-to-current converter output line, and wherein the first DA amplifier has a first DA amplifier output line connected to the first DA output line.

9. The colorblind video adapter recited in claim 1,
wherein the second DA includes a second DA first voltage-to-current converter, the second DA first voltage-to-current converter having a second DA first voltage-to-current converter first input line connected to the second DA red input line, the second DA first voltage-to-current converter having a second DA first voltage-to-current converter second input line connected to the second DA green input line, the second DA first voltage-to-current converter having a second DA first voltage-to-current converter output line, wherein the second DA includes a second DA second voltage-to-current converter, the second DA second voltage-to-current converter having a second DA second voltage-to-current converter first input line connected to a second DA ground input line, the second DA second voltage-to-current converter having a second DA second voltage-to-current converter second input line connected to the second DA output line, the second DA second voltage-to-current converter having a second DA second voltage-to-current converter output line, and wherein the second DA includes a high-impedance node connected to the second DA first voltage-to-current converter output line and the second DA second voltage-to-current converter output line, and wherein the second DA amplifier has a second DA amplifier output line connected to the second DA output line.

10. A colorblind video adapter, comprising:
an input port configured to receive a red input RGB video signal and a green input RGB video signal;
a first difference amplifier (first DA) configured to produce a red contrast signal by amplifying the red input video signal relative to the green input video signal;
a second difference amplifier (first DA) configured to produce a green contrast signal by amplifying the green input video signal relative to the red input video signal;
a third difference amplifier (third DA) configured to produce a red intensity signal by summing the red contrast signal and the red input RGB video signal, the red contrast signal being proportional to a difference between the red video input signal and the green video input signal;
a fourth difference amplifier (fourth DA) configured to produce a green intensity signal by summing the green contrast signal and the green input RGB video signal, the green contrast signal being proportional to a difference between the green video input signal and the red video input signal, the third DA being different from the fourth DA; and
an output port configured to transmit a red output RGB video signal and a green output RGB video signal based on the red intensity signal and the green intensity signal.

11. The colorblind video adapter recited in claim 10, further comprising:
a first potentiometer configured to modulate the red intensity signal; and
a second potentiometer configured to modulate the green intensity signal.

12. The colorblind video adapter recited in claim 10, wherein the first DA is connected to the third DA via a red clipper circuit configured to limit a signal strength associated with the red contrast signal, and wherein the second DA is connected to the fourth DA via a green clipper circuit configured to limit a signal strength associated with the green contrast signal.

13. A colorblind video adapter comprising:
an input port configured to receive an input video signal, the input video signal comprising red, green, and blue RGB video input signals;
a video signal processor configured to:
amplify a first contrast level of the red video input signal relative to the green video input signal to create a red video output signal by adding to the red video input signal a first amount proportional to a difference between the red video input signal and the green video input signal, and
amplify a second contrast level of the green video input signal relative to the red video input signal to create a green video output signal by adding to the green video input signal a second amount proportional to a difference between the green video input signal and the red video input signal;
an output port configured to transmit an output video signal, the output video signal comprising the altered red and green video output signals and the unaltered blue video input signal; along with the horizontal and vertical sync signals; and
a display device configured to display information based on the output video signal.

14. The colorblind video adapter recited in claim 13, wherein the video signal processor includes a first difference amplifier (DA) configured to amplify the first contrast level, and wherein the video signal processor includes a second DA configured to amplify the second contrast level.

15. The colorblind video adapter recited in claim 14, wherein the video signal processor includes a third DA configured to determine a red intensity level for the altered red video output signal, and wherein the video signal processor includes a fourth DA configured to determine a green intensity level for the altered green video output signal.

16. The colorblind video adapter recited in claim 15, wherein the third DA receives as output a red contrast signal from the first DA, and wherein the fourth DA receives as output a green contrast signal from the second DA.

17. The colorblind video adapter recited in claim 16, wherein the first DA is connected to the third DA via a red clipper circuit configured to limit a signal strength associated with the red contrast signal.

18. The colorblind video adapter recited in claim 16, wherein the second DA is connected to the fourth DA via a green clipper circuit configured to limit a signal strength associated with the green contrast signal.

19. The colorblind video adapter recited in claim 13, the system further comprising:
a first potentiometer configured to modulate the red video output signal; and
a second potentiometer configured to modulate the green video output signal.

20. The colorblind video adapter recited in claim 19, the system further comprising:
a user input port configured to receive a signal for adjusting the first potentiometer and the second potentiometer.

* * * * *